AUTOMATIC FREQUENCY CONTROL

Filed Sept. 11, 1956 2 Sheets-Sheet 1

INVENTOR
CHRISTOPHER EDMUND GERVAISE BAILEY
BY Fred M. Vogel
AGENT

INVENTOR
CHRISTOPHER EDMUND GERVAISE BAILEY
BY Fred M. Vogel
AGENT

United States Patent Office 2,897,450
Patented July 28, 1959

2,897,450

AUTOMATIC FREQUENCY CONTROL

Christopher Edmund Gervaise Bailey, Tower Hill, Dorking-Surrey, England, assignor, by mesne assignments, to North American Philips Company, Inc., New York, N.Y., a corporation of Delaware Application September 11, 1956, Serial No. 609,302

Claims priority, application Netherlands September 23, 1955

5 Claims. (Cl. 331—18)

This invention relates to circuit-arrangements for automatic frequency correction (AFC) of a high-frequency oscillator relative to the frequency of a control wave, in which a frequency corrector, which is controllable by means of a regulating voltage, is coupled to the high-frequency oscillator, which arrangement comprises a regulating voltage generator with a mixer stage functioning as a phase-discriminator and being controlled by impulses that are in synchronism with the control voltage, and by a voltage derived from the high-frequency oscillator, and, in which arrangement a regulating voltage, which is taken from the output circuit of said mixer stage, controls via a low-pass filter the frequency corrector in order to stabilize the frequency of the high-frequency oscillator with regard to a higher harmonic of the control-frequency.

Such arrangements are known for example from U.S. Patent No. 2,574,482, issued November 13, 1951, and U.S. Patent No. 2,736,803, issued February 28, 1956.

Particular consideration invariably has to be given to the proportioning of the low-pass filter of the regulating voltage circuit. It should greatly attenuate the control frequency and its harmonics, since in the case of insufficient attenuation these will control the frequency corrector and frequency-modulate the output voltage of the high-frequency oscillator thereby producing the side-band frequencies normally occurring in frequency-modulation. On the other hand, the low-pass filter in the regulating-voltage circuit should pass as broad a band as possible since, during the catching, the beat-frequency between a multiple of the control frequency and the frequency of the high-frequency oscillator has to be passed on until catching via frequency modulation of the high-frequency oscillator occurs. If the said beat-frequency is passed only when it is very low, the catching range of the AFC-circuit is unduly restricted. Finally, stringent requirements should be imposed on the phase characteristic of the regulating voltage filter, in that instability of the AFC-circuit may occur even when its phase shift is 90°, contrasted with the well-known "Nyquist criterion" of 180° in normal negative-feedback. The requirements to be imposed on the filter, which have only been briefly referred to in the foregoing, are fully mentioned in par. 7 of an article by J. Bruysten et al., published in "Communication News," volume XIII No. 1, dated February 1953.

In many known AFC-circuits of the type referred to in the preamble, a search voltage generator is used to increase the catching range, which generator causes slow frequency modulation of the high-frequency oscillator in order to catch and stabilize the high-frequency oscillator automatically with regard to a higher harmonic of the control voltage. However, the use of a search voltage generator often complicates the arrangement considerably.

Sometimes, particular desiderata are imposed on the modulation characteristic of the loop circuit in conjunction with stabilisation of the high-frequency oscillator, for example on a frequency-modulated control wave. In such a case the modulation characteristic should be flat, that is to say the response sensitivity of the loop circuit to voltages of modulation frequency should be substantially constant within the range of modulation frequencies. In practice, this is often difficult to ensure and the modulation characteristic is usually strongly peaked near a comparatively low frequency, say 8 to 10 kc./s.

In other circuits of the aforesaid type, particularly loop circuits, in which the high-frequency oscillator is stabilized with regard to at least two control waves such as, for example, described in U.S. patent specification 337,592, in which said control waves are supplied to two mixer stages succeeding each other in the loop circuit, suppression of undue mixing products entails particular difficulties. However, such undue mixing products provoke parasitic frequency modulation of the high-frequency oscillator signal via the frequency corrector, which is undesirable.

In loop circuits of the last-mentioned type comprising two successive mixer stages, the high-frequency oscillator may be stabilized either on the sum-frequency or on the difference frequency of the two control waves. In practice, said dual feasibility of stabilisation is often objectionable. As a matter of fact, in order to prevent stabilisation on undue combination frequencies, particular precautions are required such as, for example a fairly accurate pre-adjustment of the frequency of the high-frequency oscillator.

The present invention has for its object to provide improvements of arrangements of the type referred to in the preamble, thereby mitigating or obviating one or more of said disadvantages.

To this end, in accordance with the invention, a pulse frequency-passing feedback circuit is provided between the output circuit of the mixer stage functioning as a phase discriminator and the control voltage circuit connected to an input of said mixer stage.

In order that the invention may be readily carried into effect examples thereof will now be described with reference to the accompanying drawings, in which Fig. 1 shows a partly detailed circuit arrangement obtained by completing, in accordance with the invention, the aforesaid article in "Communication News."

Figure 1:
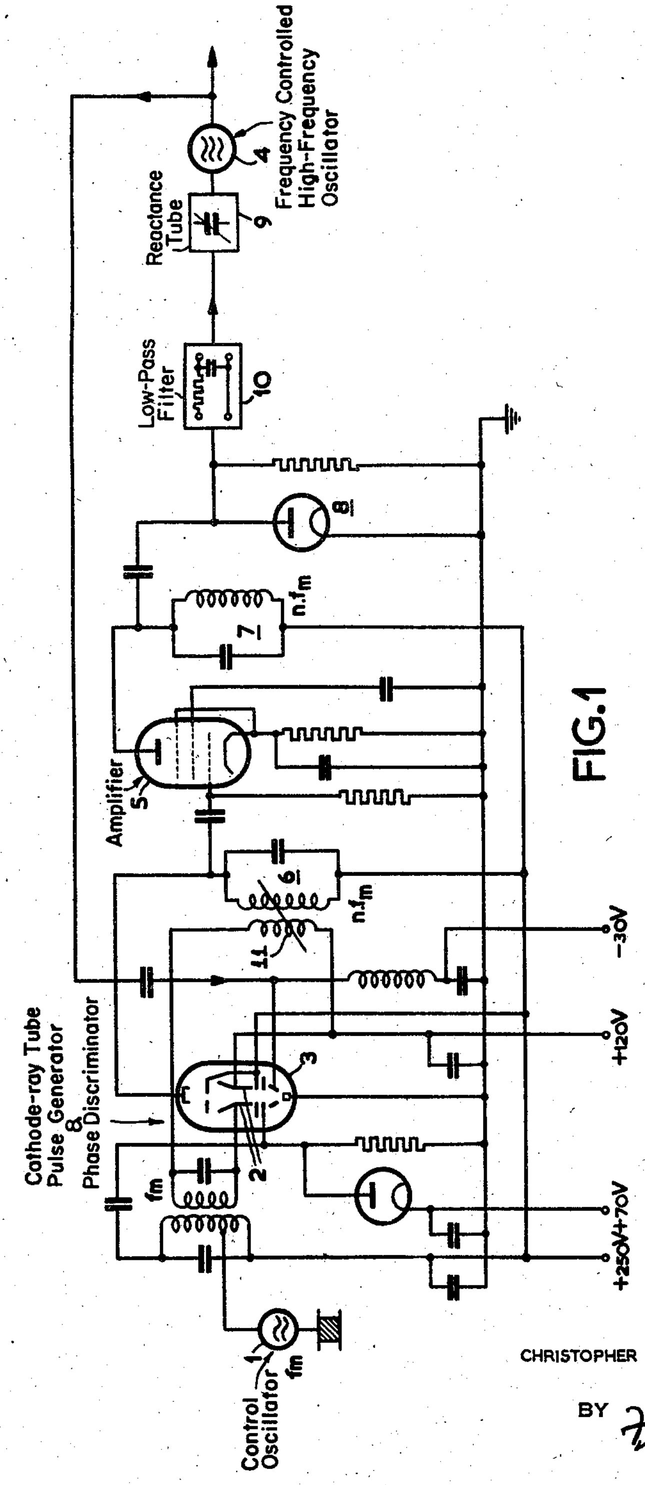

In Fig. 1 a crystal oscillator is designated by 1; this oscillator produces a sinusoidal control-oscillation of a frequency $f_m$. The control-voltage is applied to deflection plates 2 of a beam deflection tube 3, type E80T. This deflection tube, which is explicitly described in U.S. Patent No. 2,736,803, issued February 28, 1956, acts as a gate switch, and passes on signals from a high frequency oscillator 4 only during a narrow phase angle of the control frequency $f_m$ if the potential difference between the deflector plates, which difference is caused by the control voltage, is about ±8 volts. A component of a frequency 2 $f_m$ (or another harmonic of the control frequency) of the pulsatory output voltage on the anode of the deflection tube is selected and amplified by a pentode 5 with tuned input and output circuits 6 and 7 respectively. The voltage across the output circuit 7 yields, when rectified by a rectifier 8, a direct regulating voltage. The D.C.-regulating voltage is supplied to a reactance tube 9, which is coupled to the HF-oscillator 4, via a lowpass filter 10 so as to stabilize the frequency of the HF-oscillator 4 on a harmonic $nf_m$ of the control frequency $f_m$. Further details of the operation of the circuit are given in the above-mentioned U.S. Patent No. 2,736,803.

In accordance with the invention a feedback coil 11, which is connected in series in the feed circuit of the left-hand deflection plate of the tube 3, is closely coupled to the coil of the resonant circuit 6. The effect of providing a feedback coil 11 in the aforesaid manner may be seen as follows. Suppose that the electron beam moved to and fro in tube 3 strikes the tube anode at a moment when the output voltage of the HF-oscillator 4 is positive, and also suppose that the potential of the left-hand deflection plate is increasing due to the signal from the control oscillator 1. The anode of tube 3 will then draw current, and a voltage of negative polarity is set up across the feedback coil 11 due to its inductive coupling with the anode circuit 6. This voltage is applied to the deflection plates with a polarity such that it retards the further deflection of the electron beam. Since the circuit 6 is tuned to double the control frequency $f_m$, the same negative feedback voltage will be set up as soon as the electron beam next time passes the anode in the same direction of deflection. Thus the instant of occurrence or the phase of the output pulse is retarded.

If, in the case supposed, the output voltage of the HF-oscillator 4 is negative, the circumstances otherwise being the same, then the anode of tube 3 will practically not draw current and the phase of the output pulse will therefore practically not be retarded.

The use of the feetback coil 11, in accordance with the invention, provides a feedback of phase of the pulsatory output voltage to the sinusoidal control voltage determining the instant of the gate pulse. This feedback has the correct polarity for stabilisation of the AFC-circuit referred to if the frequency corrector is poled in such manner that an increase in output voltage of deflection tube 3 involves an increase in frequency of HF-oscillator 4. This poling is otherwise normal in circuit-arrangements of the type concerned, the regulating voltage rectifier delivering a negative output voltage which controls a reactance tube operating as a capacity.

In a practical example of the device described with reference to Fig. 1 it proved advantageous to proportion the feedback coil 11 such that its output voltage was approximately 10 volts.

The stabilisation properties of the whole circuit, improved in accordance with the invention, permit the designer either to stabilise a previously unstable circuit, or, by increasing the pass-band of the regulating voltage filter or the sensitivity (kc./s. per volt) of the frequency corrector, to increase the catching range; alternatively, of course, a combination of these two effects may be aimed at.

In addition to the above advantages the shown feedback-circuit causes a negative feedback-effect with regard to alternating voltages superimposed on the regulating direct voltage. The same applies to the modulation characteristic of the loop circuit, resulting in reduction or removal of peaks in the modulation characteristic. It has furthermore been found that the feedback-circuit as shown causes a saw-tooth variation of the D.C.-regulating voltage supplied to the frequency corrector 9 if the high frequency oscillator is not stabilised on a harmonic of the control frequency. This saw-tooth voltage causes a gradual and slow variation of the frequency of the HF-oscillator 4 until catching occurs and thus replaces a special search voltage generator. All the above-mentioned effects are more pronounced as the harmonic frequency-relationship between the controlling and controlled frequency is of higher order.

Figures 2, 3:
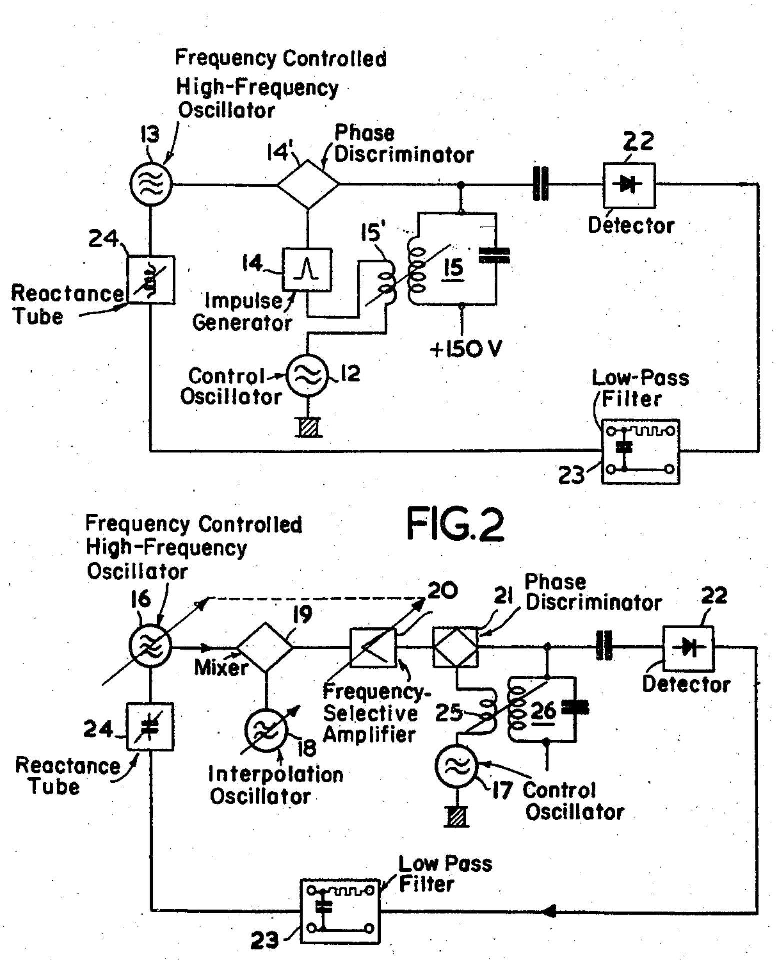
Fig. 2 shows a diagram mainly in block schematic form of another form of a circuit-arrangement according to the invention.
Fig. 3 illustrates, again mainly in block schematic form, the use of the invention in a loop circuit with two successive mixer stages.

The present invention may alternatively be employed without using the deflection valve referred to which simultaneously acts as mixer and pulse generator. This is illustrated in Fig. 2 showing, mainly in block-schematic form, a circuit arangement in accordance with the invention. Here 12 is a lower-frequency control oscillator and 13 is the HF-oscillator to be stabilised. An impulse generator 14 is synchronised by the control oscillator 12 and supplies sharp output pulses whenever its control voltage attains a predetermined instantaneous voltage. The pulses and the output voltage of HF-oscillator 13 control a normally cut-off- mixer stage 14′, for example a hexode to control grids of which the two input voltage are applied. The output of the mixer stage 14′ is connected, via a detector 22 and a low-pass filter 23, to a reactance tube 24 associated with the oscillator 13. The output circuit of the mixer stage contains a circuit 15 tuned to the control frequency or a higher harmonic thereof. In accordance with the invention a feedback coil 15 is connected in series combination in the connection between the control oscillator 12 and the pulse generator 14. Thus, a part of the output voltage of the mixer stage is added to the control voltage of the impulse generator. It is to be noted that this addition is not only obtainable by means of a simple series-connection as shown, but also through the intermediary of an additional amplification stage.

Fig. 3 shows, again mainly in block-schematic form, another embodiment of the invention. In this embodiment 16 denotes a HF-oscillator to be frequency-stabilised and the tuning of which is variable e.g. between 20 to 40 mc./s. This frequency is stabilised on a combination frequency of a suitable higher harmonic between 17 and 36 mc./s. of a 1 mc./s. crystal in control oscillator 17 and an interpolation oscillator 18, the output frequency of which is variable within a frequency range equalling the control frequency, e.g. of 3 to 4 mc./s.

The output voltage of the HF-oscillator and the interpolation oscillator is fed to a mixer stage 19 in order to obtain a beat frequency corresponding to a harmonic of the control frequency. If the interpolation frequency is e.g. 3.27 mc./s. and the HF-oscillator 16 is tuned to a frequency of about 36.27 mc./s. then a difference frequency of about 33 mc./s. is produced in the mixer stage 19. This difference frequency is amplified by a selective amplifier 20 the tuning means of which are coupled to the tuning means of HF-oscillator 16. The amplified voltage of difference frequency is fed to a mixer stage 21 acting as a phase discriminator, which is controlled by the 1 mc./s. control frequency of control oscillator 17. This mixer stage, which may comprise a deflection tube Philips E80T as in the embodiment shown in Fig. 1, furnishes an output voltage which, after detection in detector 22 and smoothing by low-pass filter 23, yields a D.C.-regulating voltage to control a variable reactance 24 in order to stabilise the HF-oscillator 16 on the desired combination frequency.

In prior circuits of the above-described type, such as that of U.S. Patent specification 337,592, usually a search voltage generator was used to obviate stringent initial setting requirements of the HF-oscillator 16.

By using, in accordance with the invention, a feedback circuit 25, 26 of the type mentioned above between the output of the mixer stage 21 acting as a phase discriminator and the supply lead for the control frequency to said mixer stage several important advantages are achieved.

Apart from improvement in stability properties and a flattening of the modulation characteristic of the loop circuit, undesired mixing products generated in the successive mixer stages 19 and 21 of the loop circuit are appreciably attenuated. Furthermore the feedback-circuit, as explained in connection with Fig. 1, causes a suitable search voltage if the HF-oscillator 16 is not stabilized, thus rendering the use of a special search voltage generator superfluous.

Finally, by taking the feedback voltage from an output circuit of mixer stage 21 which is tuned to the second or other even harmonic of the control frequency, and by appropriately choosing the polarity of the feedback-voltage added to the control voltage, stabilisation on e.g.

the desired sum frequency of the control voltage oscillators is improved, and stabilisation on the difference frequency is counteracted or prevented, thus reducing inter alia the selectivity requirements to be imposed on the selective amplifier 20.

What is claimed is:

1. An automatic frequency correction circuit comprising an oscillator to be controlled, a frequency-control circuit connected to said oscillator, a control oscillator circuit, a phase-discriminating mixer stage having two input circuits respectively connected to receive the oscillations from said control oscillator circuit and the oscillations from said oscillator to be controlled, whereby said mixer produces a pulsatory control voltage which varies in accordance with any frequency variation between the frequencies of said control oscillator circuit and said oscillator to be controlled, a low-pass filter, means connected to apply said control voltage through said low-pass filter to said frequency-control circuit, and a feedback circuit connected to feed said pulsatory control voltage to said mixer input circuit which is connected to receive the oscillations from said control oscillator circuit.

2. A circuit as claimed in claim 1, in which said mixer comprises a cathode a cathode-ray tube having a source of an electron beam, an apertured plate, an output anode positioned behind the aperture in said plate, and means for causing said electron beam to scan across said aperture whereby the electrons which pass through said aperture and strike said anode produce said pulsatory control voltage.

3. A circuit as claimed in claim 1, in which said control oscillator circuit includes a pulse-producing circuit for providing pulsatory output oscillations.

4. A circuit as claimed in claim 1, in which said mixer stage comprises a resonant output circuit tuned to a frequency equal to an integer times the frequency of said control voltage, and in which said feedback circuit includes a feedback coil coupled to said resonant output circuit and connected in series with said mixer input circuit which is connected to receive the oscillations from said control oscillator circuit.

5. A circuit as claimed in claim 1, including an interpolation oscillator, a second mixer stage interposed in the input circuit of the first-named mixer stage which is connected to receive oscillations from the oscillator to be controlled, said second mixer stage having input circuits respectively connected to said interpolation oscillator and to said oscillator to be controlled and having an output circuit connected to the last-mentioned input circuit of said first-named mixer stage, said first-named mixer stage comprising a resonant output circuit tuned to an even harmonic of the frequency of said control voltage, and means connecting said feedback circuit to said resonant output circuit.

References Cited in the file of this patent

UNITED STATES PATENTS

| | | |
|---|---|---|
| 2,770,730 | Urtel | Nov. 13, 1956 |
| 2,775,703 | Bourgonjon | Dec. 25, 1956 |